United States Patent
Bouchard (12)

(10) Patent No.: US 12,313,140 B2
(45) Date of Patent: May 27, 2025

(54) TOOLING OF MULTI-PILE PLATES FOR SEMI-FORCED FLOW

(71) Applicant: SAFRAN LANDING SYSTEMS, Velizy-Villacoublay (FR)

(72) Inventor: Eric Bouchard, Moissy-Cramayel (FR)

(73) Assignee: SAFRAN LANDING SYSTEMS, Velizy-Villacoublay (FR)

( * ) Notice: Subject to any disclaimer, the term of this patent is extended or adjusted under 35 U.S.C. 154(b) by 0 days.

(21) Appl. No.: 18/838,783

(22) PCT Filed: Feb. 16, 2023

(86) PCT No.: PCT/FR2023/050206
§ 371 (c)(1),
(2) Date: Aug. 15, 2024

(87) PCT Pub. No.: WO2023/156737
PCT Pub. Date: Aug. 24, 2023

(65) Prior Publication Data
US 2025/0109775 A1 Apr. 3, 2025

(30) Foreign Application Priority Data
Feb. 16, 2022 (FR) .................................... 2201359

(51) Int. Cl.
C04B 35/52 (2006.01)
C04B 38/00 (2006.01)
F16D 69/02 (2006.01)

(52) U.S. Cl.
CPC ............ *F16D 69/023* (2013.01); *C04B 35/52* (2013.01); *C04B 38/0093* (2013.01);
(Continued)

(58) Field of Classification Search
CPC ................ C04B 35/52; C04B 38/0093; C04B 2235/614; C04B 2235/94
(Continued)

(56) References Cited

U.S. PATENT DOCUMENTS

2005/0178327 A1 8/2005 Rudolph et al.
2017/0247793 A1 8/2017 Rudolph et al.

FOREIGN PATENT DOCUMENTS

FR 2 754 813 A1 4/1998
FR 2 821 859 A1 9/2002
(Continued)

OTHER PUBLICATIONS

International Search Report as issued in International Patent Application No. PCT/FR2023/050206, dated May 15, 2023.
(Continued)

*Primary Examiner* — Christina A Johnson
*Assistant Examiner* — Xue H Liu
(74) *Attorney, Agent, or Firm* — Pillsbury Winthrop Shaw Pittman LLP

(57) ABSTRACT

A method for densifying porous annular substrates having a central passage by chemical vapor infiltration, the method including providing stacks of porous annular substrates, providing a plurality of individual modules including stacks disposed on a support plate having a perforated injection tube each mounted on a gas inlet opening, forming a stack of individual modules, aligning the individual modules of the stack in a sealed manner by means of an annular seal disposed between the injection tubes of a second individual module and the gas inlet openings of a first individual module with which it cooperates, and injecting into the internal volume of each stack of porous annular substrates a gas phase including a gaseous precursor of a matrix material to be deposited within the porosities of the substrates.

13 Claims, 5 Drawing Sheets

(52) U.S. Cl.
 CPC .... *C04B 2235/614* (2013.01); *C04B 2235/94* (2013.01); *F16D 2250/0092* (2013.01)

(58) Field of Classification Search
 USPC .......................................................... 264/82
 See application file for complete search history.

(56) References Cited

FOREIGN PATENT DOCUMENTS

| | | | |
|---|---|---|---|
| FR | 2 834 713 | A1 | 7/2003 |
| FR | 3 084 892 | A1 | 2/2020 |

OTHER PUBLICATIONS

Written Opinion of the International Searching Authority as issued in International Patent Application No. PCT/FR2023/050206, dated May 15, 2023.

[Fig. 1]
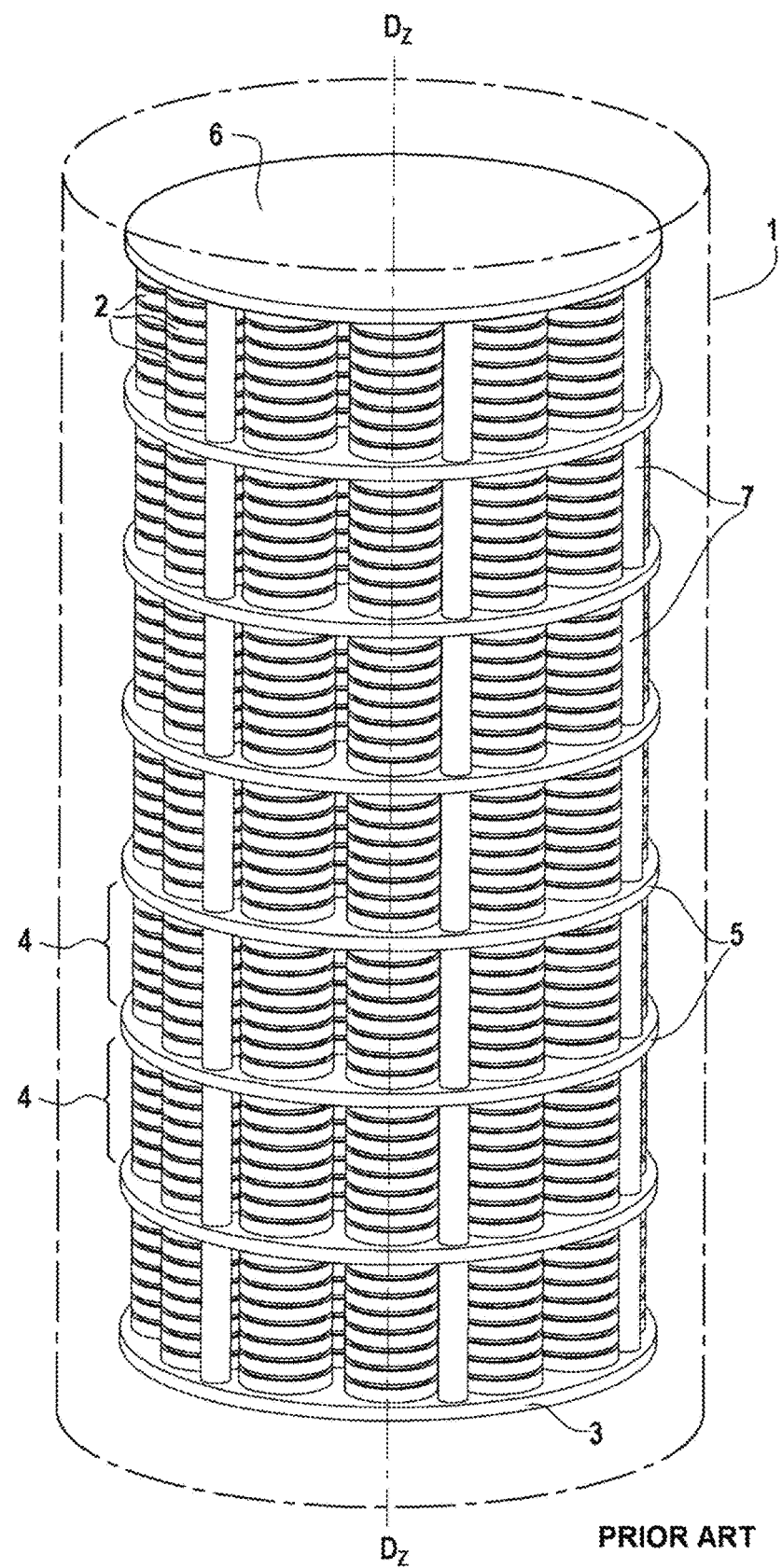
PRIOR ART

[Fig. 2]
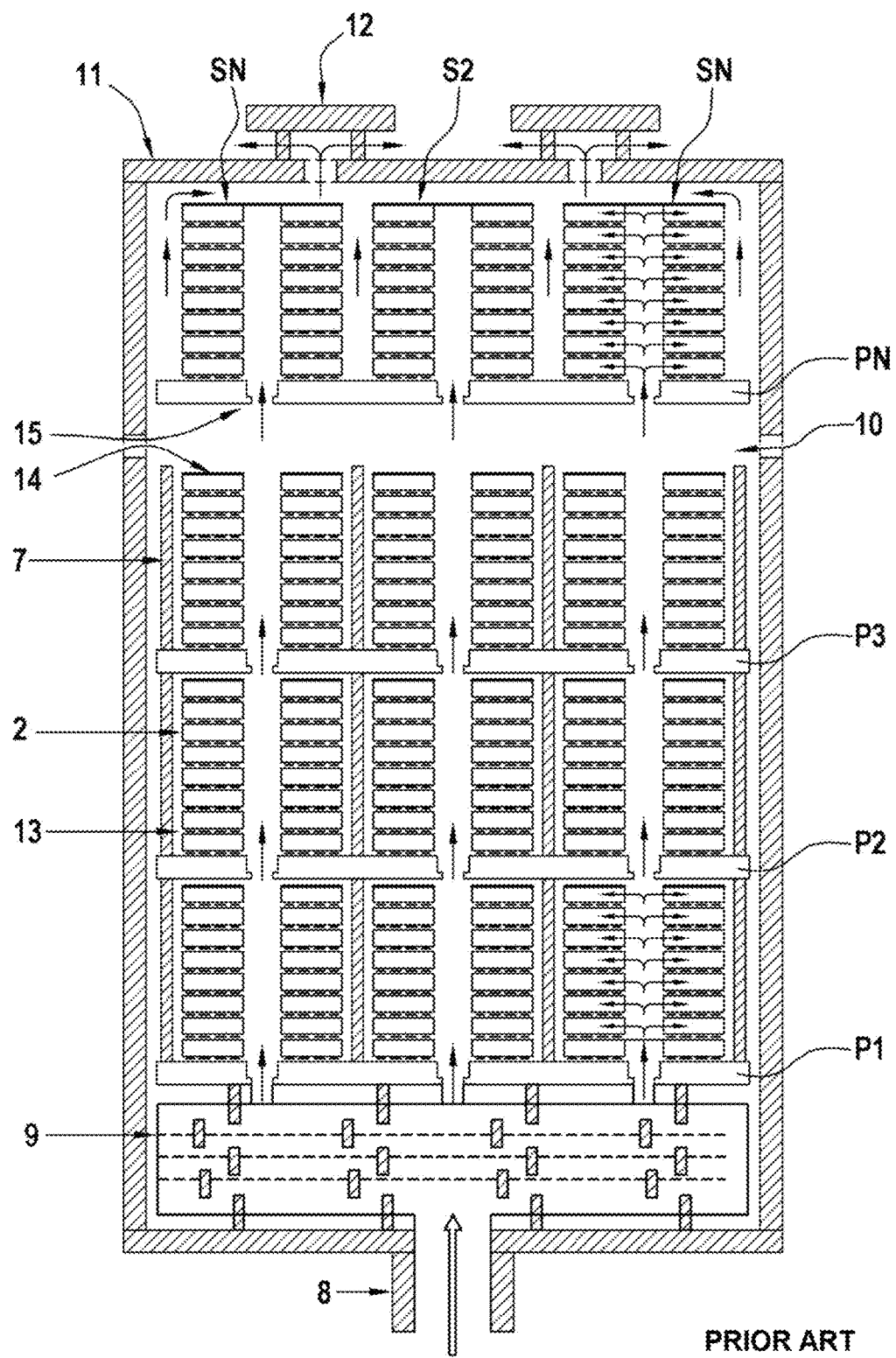
PRIOR ART

[Fig. 3]
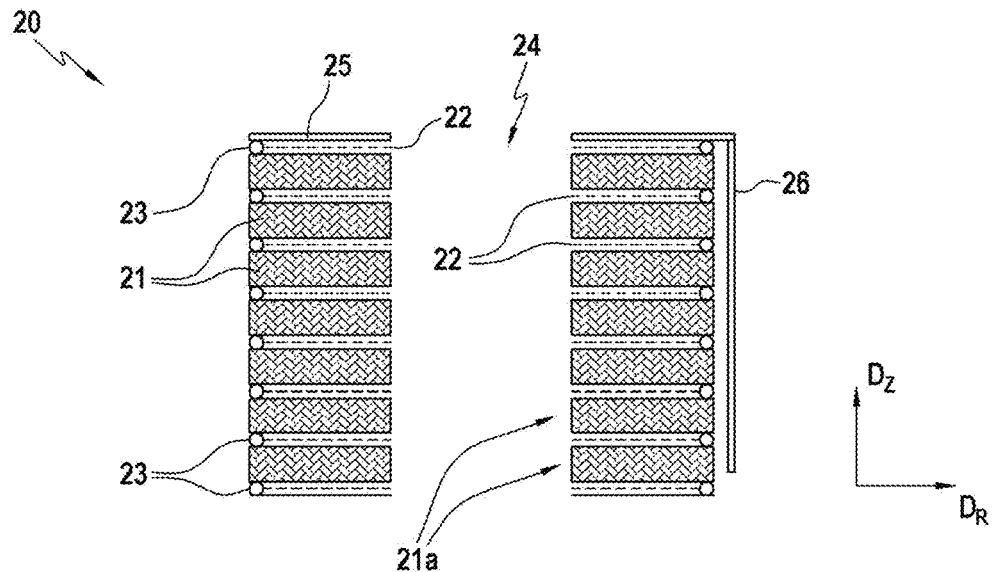
[Fig. 4]
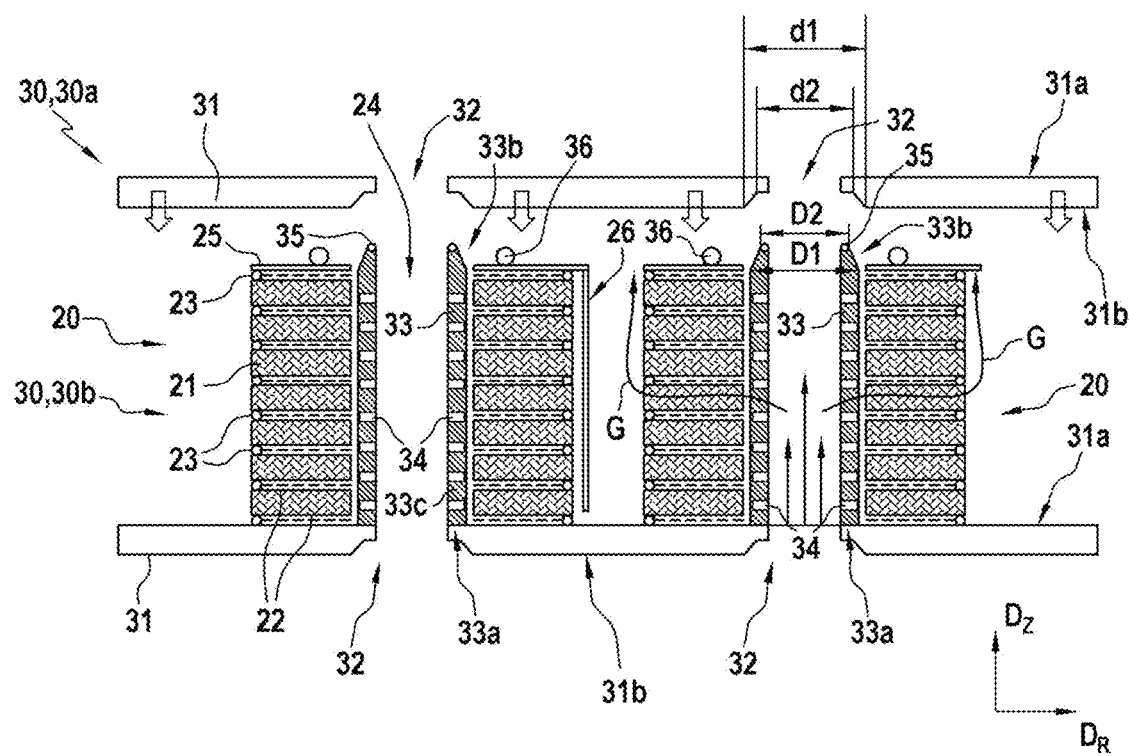

[Fig. 5]
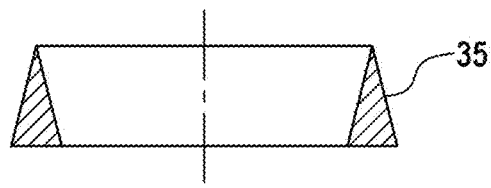
[Fig. 6]
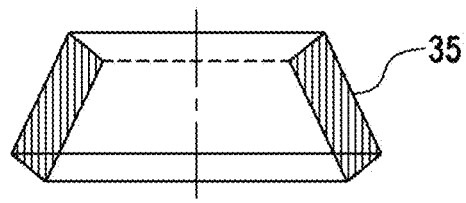
[Fig. 7]
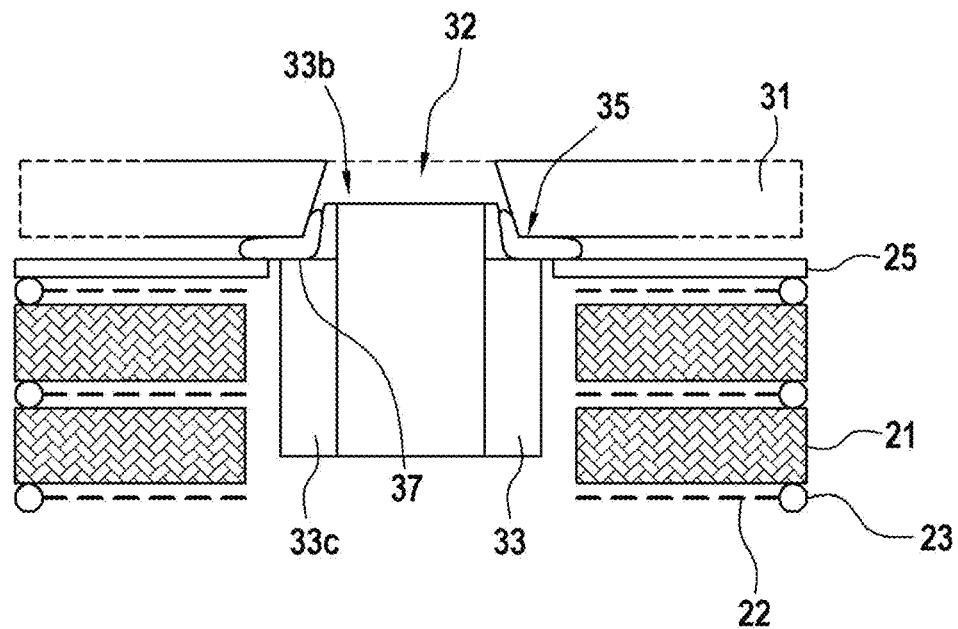

TOOLING OF MULTI-PILE PLATES FOR SEMI-FORCED FLOW

CROSS-REFERENCE TO RELATED APPLICATIONS

This application is the U.S. National Stage of PCT/FR2023/050206, filed Feb. 16, 2023, which in turn claims priority to French patent application number 22 01359 filed Feb. 16, 2022. The content of these applications are incorporated herein by reference in their entireties.

TECHNICAL FIELD

The invention concerns the production of composite material parts comprising a porous annular substrate densified by chemical vapor infiltration (CVI), and more particularly to the production of parts provided with a central passage.

The invention is especially, but not exclusively, applicable to the production of annular brake discs or diverging nozzles for rocket engines made of thermostructural composite material.

PRIOR ART

Thermostructural composite materials are noteworthy for their excellent mechanical properties and their ability to retain these properties at high temperature. Typical examples of thermostructural composite materials are carbon-carbon (C—C) composites comprising a porous reinforcing substrate of carbon fibers densified by a carbon matrix and ceramic matrix composites (CMC) comprising a porous reinforcing substrate of refractory fibers (e.g. carbon or ceramic) densified by a ceramic matrix (e.g. silicon carbide).

C—C composite materials are commonly used for aircraft brake discs due to their high-energy tribological characteristics, their non-brittleness, their thermal characteristics (conductivity and caloric capacity) and their density.

The densification of porous substrates by chemical vapor infiltration (CVI) consists of placing the annular preforms in a reaction chamber of an infiltration installation and admitting into the chamber a gas phase, one or more constituents of which form a precursor of the matrix material to be deposited within the substrates to ensure their densification. The infiltration conditions, especially the composition and flow rate of the gas phase, and the temperature and pressure in the chamber, are chosen to allow diffusion of the gas phase within the accessible internal porosity of the substrates so that the desired material is deposited therein by decomposition of a constituent of the gas phase or by reaction between several constituents thereof. Document FR 2,834,713 describes such a method and an installation for implementing it.

The conditions for chemical vapor infiltration of pyrolytic carbon, or pyrocarbon, have long been known to the person skilled in the art. The carbon precursor is an alkane, an alkyl or an alkene, generally propane, methane or a mixture of the two. The infiltration is carried out at a temperature of approximately 1000° C. under a pressure of approximately 1 kPa, for example.

The gas phase containing the precursor(s) of material to be deposited within the preforms is admitted at one longitudinal end of the reaction chamber, while the residual gases are evacuated at the opposite end from where they are extracted by pumping means.

When it is desired to densify a large number of stacks of substrates, a large installation is generally used. A known example of loading of disks that can be used in a reaction chamber commonly referred to as a "densification furnace" is illustrated in FIG. 1.

The chamber 1 is cylindrical around an axis X. The load comprises a plurality of stacks of porous annular substrates 2 carried by the same lower support plate 3. Each stack extends in the form of a column and is formed by several sections 4 of superimposed stacks separated by intermediate support plates 5 common to all the stacks. The plates 3 and 5 comprise openings aligned with central passages of the substrates 2 in order to circulate, in each stack, a reactive gas phase which will then pass through the substrates 2 to densify them. A susceptor cover forms an upper plate 6 which surmounts the load and closes the internal volume of each stack (R1). The intermediate support plates 5 are held with vertical rods 7.

A high temperature treatment workshop combining industrial means for CVI, as well as carbonization or heat treatment of annular preforms and heat treatment on partially or totally densified blanks is organized around plates composed of one to several stacks, typically from 8 to 19 stacks, depending on the size of the rooms and the size of the furnaces. These plates are moved by overhead cranes with slings. They are also stored in racks or stacker cranes, which are taken to the various workstations (furnace loading, density check, etc.).

FIG. 1 is a representation of the hot zone of a directed flow load. As detailed in FIG. 2, which shows a sectional view of the densification furnace of FIG. 1, this hot zone comprises, from its base to its top: an inlet for the reaction gas mixture 8, then a preheating zone 9 which increases the temperature of the gases to the densification temperature, and finally the loading zone 10. At the top of the furnace, at the susceptor cover 11, chimneys 12 are installed in the cover 11, through which the effluent gases resulting from the deposition reaction are evacuated.

The load consists of a number $N_1$ of plates, referenced P1 to PN, each capable of supporting a number of stacks $N_2$ of porous annular substrates 2, the stacks being referenced S1 to SN. The number of plates and the number of stacks are related to the dimensions of the furnace and to those of the disks, i.e., of the porous annular substrates 2.

On each plate are found stacks of disks 2 separated by spacers 13, each stack terminating at its top in a cover disk 14 which limits leaks. At the base of each stack is a found a shell 15 resting on the cover disk 14 of the lower stack. This shell 15 makes it possible, by sliding, to compensate for the differences in height between stacks. Finally, rods 7 are installed between the stacks S1 to SN which serve to take up the mass of the upper plates P2 to PN.

The gases at the end of the preheating zone 9 enter each of the columns constituted by the stacks S1 to SN of disks 2. The gas passes from the inside to the outside of the columns of disks, through leaks formed by the porosities of each preform 2, the clearance between disks 2 created by the spacers 13, and through the passages between plates 3 and 5 (P1 to PN), at the location of the sliding clearances of the shell, the shell 15 allowing the gases to leak by sliding.

Document FR 2,821,859 discloses a chemical vapor infiltration densification method for porous substrates especially using a semi-forced flow. To adapt the semi-forced flow as described in this document, leaks between the disks must be controlled and leaks at the passage between plates must also be controlled. This last point is the most difficult because the disk stacks are not of the same height. And in the absence of an excellent control of this seal at the top of each stack, the pressure difference necessary to force the gas to go into the porosities of the disks 2 cannot be obtained.

It is also known from patent FR 3,084,892 to replace the rods with gas distributors, which make it possible to simultaneously perform the functions of taking up the load (function previously performed by the rods), guiding the gases (cold), which avoids cooling the disks, and gas distribution at the preform level.

DISCLOSURE OF THE INVENTION

The aim of the invention is to provide a technical solution for the implementation of a densification method by pressure gradient which makes it possible to improve the distribution of the reactive gas within a loading zone of a densification furnace and, in general, to reduce densification gradients between substrates located at different locations in the loading zone, without affecting the loading capacity of the furnace, or even increasing it.

One object of the invention proposes a densification method by pressure gradient chemical vapor infiltration of porous annular substrates having a central passage, the method comprising at least the following steps:

providing a plurality of stacks of porous annular substrates, each stack comprising an internal volume formed by the central passages of the stacked substrates, providing a plurality of individual modules, each individual module comprising a support plate and a stacks of porous annular substrates disposed on the support plate, the support plate comprising, for each stack, a gas inlet opening emerging into the internal volume, forming, in the chamber of a densification furnace, a stack of individual modules, each first gas inlet opening of the support plate of a first individual module mounted on a second individual module communicating with the internal volume of one of the stacks of the second individual module so as to permit the circulation of a gas between the individual modules, and injecting into the internal volume of each stack of porous annular substrates a gas phase comprising a gaseous precursor of a matrix material to be deposited within the porosities of the substrates.

According to a general characteristic of the invention, for each second individual module surmounted by a first individual module, each stack comprises at least one cover ring supported on the top of the stack of porous annular substrates via an annular spacer and a sealing ring disposed around the annular spacer in a plane perpendicular to the direction in which the porous annular substrates are stacked, and a deformable annular seal disposed between the at least one cover ring and the support plate of said first individual module.

Said at least one cover ring forms a cover supported on the top of the stack via an annular spacer. The function of the cover of a stack and the associated annular seal is to seal a stack and thus reduce gas leakage. The cover and the deformable annular seal thus reinforce the seal between the support plate of the upper individual module and the cover.

In addition, in the case where a stack is lower than one or more other stacks of the same individual module, the stack in question can comprise several superposed covers to compensate for the deficit in height.

The spacers maintain a space between the porous annular substrates and thus increase the surface that comes into direct contact with the gas. In addition, the sealing rings thus disposed between the annular substrates prevent radial leaks between the porous annular substrates, and thus maximize the quantity of gas passing through the porous annular substrates. The sealing rings are preferably disposed at the radially outer periphery of the porous annular substrates. The sealing rings are made of Inconel, for example.

In one embodiment, each deformable annular seal may be arranged so as to be able to undergo deformation along the direction in which the porous annular substrates are stacked greater than or equal to a thickness of the cover ring, for example 3 mm. Moreover, each deformable annular seal has, for example, a thermal resistance to a temperature of 1100° C.

The deformable annular seal may be made of expanded graphite or of braids or ropes made of carbon fibers or ceramic fibers.

In an exemplary embodiment, each stack can comprise at least three legs extending, along the direction in which the porous annular substrates are stacked, from the cover disk to the support plate on which the stack is placed.

Ideally, the seals are made of a material that is more deformable than the porous annular substrates of the stacks. The three legs suspended from the cover make it possible to avoid the opposite possibility: The deformation of the porous annular substrates is thus limited by the three legs suspended from the cover and which form a load take-up system.

Advantageously, each individual module can comprise, for each stack, an injection tube mounted on the gas inlet opening and extending into the internal volume of the stack between a first tube end connected to the support plate and a second tube end which is free, the injection tube further comprising gas injection orifices opening into the internal volume, each gas inlet opening of the support plate of a first individual module mounted on a second individual module communicating with a second end of one of the injection tubes of the second individual module so as to allow the circulation of a gas between the individual modules.

In an exemplary embodiment, each support plate can comprise a first face on which the stacks are disposed and a second face opposite the first face, each gas inlet opening can comprise a frustoconical shape with a first diameter formed in the second face of the support and a second diameter smaller than the first diameter and formed in the first face or between the first and second faces of the support plate, and the second end of each injection tube can comprise a complementary frustoconical shape cooperating with the frustoconical shape of the gas inlet opening.

The injection tubes thus form male centering tools and the gas inlet openings female centering tools cooperating together to ensure good centering of the individual modules with each other.

Advantageously, the method can further comprise a sealed alignment step of the individual modules of the stack, the second end of each injection tube being inserted into a gas inlet opening of the first individual module, and the first individual module further comprising, for each injection tube, an annular tube seal disposed between the second end of the injection tube of the second individual module and the gas inlet opening of the first individual module with which it cooperates.

The invention thus makes it possible to improve the distribution of the gas in the furnace chamber and to facilitate the installation of the densification furnace. The sealing between two modules, provided by the annular tube seal, is obtained by the force of the weight alone, when the furnace is loaded.

The annular tube seal may be made of expanded graphite or of braids or ropes made of carbon fibers or ceramic fibers.

In an exemplary embodiment, each injection tube can comprise a main tubular portion forming a shoulder with the frustoconical shape of the second end, the shoulder allowing the annular tube seal to deform in a plane perpendicular to the direction in which the porous annular substrates are stacked.

In an exemplary embodiment, the annular tube seal is preferably frustoconical in shape to adapt to the shapes of the second end of the injection tubes and of the gas inlet opening.

In an exemplary embodiment, each support plate can comprise, for each injection tube, a centering ring centered around a gas inlet opening and shaped to receive an injection tube.

The centering ring thus facilitates and optimizes the fitting of the injection tubes on the support plates.

In an exemplary embodiment, each porous annular substrate can comprise carbon.

In an exemplary embodiment, each porous annular substrate may constitute a fibrous brake disc preform.

In an exemplary embodiment, each first porous annular substrate is supported a second porous annular substrate, or is supported on the support plate, by means of an annular spacer and a sealing ring surrounding the annular spacer, the sealing ring providing radial sealing between the first porous annular substrate and the second porous annular substrate or between the first porous annular substrate and said support plate.

Advantageously, each individual module surmounted by another individual module can comprise a plurality of rods extending between the support plate of said individual module and the support plate of said individual module which surmounts it to take up the mass of said at least one upper individual module.

Preferably, each rod has a height less than the height of the stacks of porous annular substrates.

In particular, each rod may have a height less than the sum, in each stack, of the thickness of the deformable annular seal, of the thickness of the cover ring, of the thickness of the sealing ring or rings, and of the thicknesses of the porous annular substrates of said stack. The thicknesses of the deformable annular seal and sealing rings must be considered without compression. When a stack comprises several cover rings, the thickness to be taken into account is that of all the cover rings.

Moreover, each rod preferably has a height greater than the sum, in each stack, of the thickness of the cover ring and the thicknesses of the porous annular substrates of said stack. When a stack comprises several cover rings, the thickness to be taken into account is that of all the cover rings.

In this document, height is understood as the dimension along which the porous annular substrates are stacked, and generally corresponds to the vertical direction.

BRIEF DESCRIPTION OF THE DRAWINGS

FIG. 1, already described, very schematically shows an example of loading porous annular substrates according to the prior art.

FIG. 2, already described, shows a sectional view of the densification furnace of FIG. 1.

FIG. 3 schematically illustrates a sectional view of an example of a stack of porous annular substrates according to the invention.

FIG. 4 schematically shows a sectional view of one example of an individual module according to the invention.

FIG. 5 shows a sectional view of a first example of an annular tube seal.

FIG. 6 schematically shows a sectional view of a second example of an annular tube seal.

FIG. 7 schematically shows a sectional view of a variant embodiment of an injection tube according to the invention.

DESCRIPTION OF THE EMBODIMENTS

Figure 8:
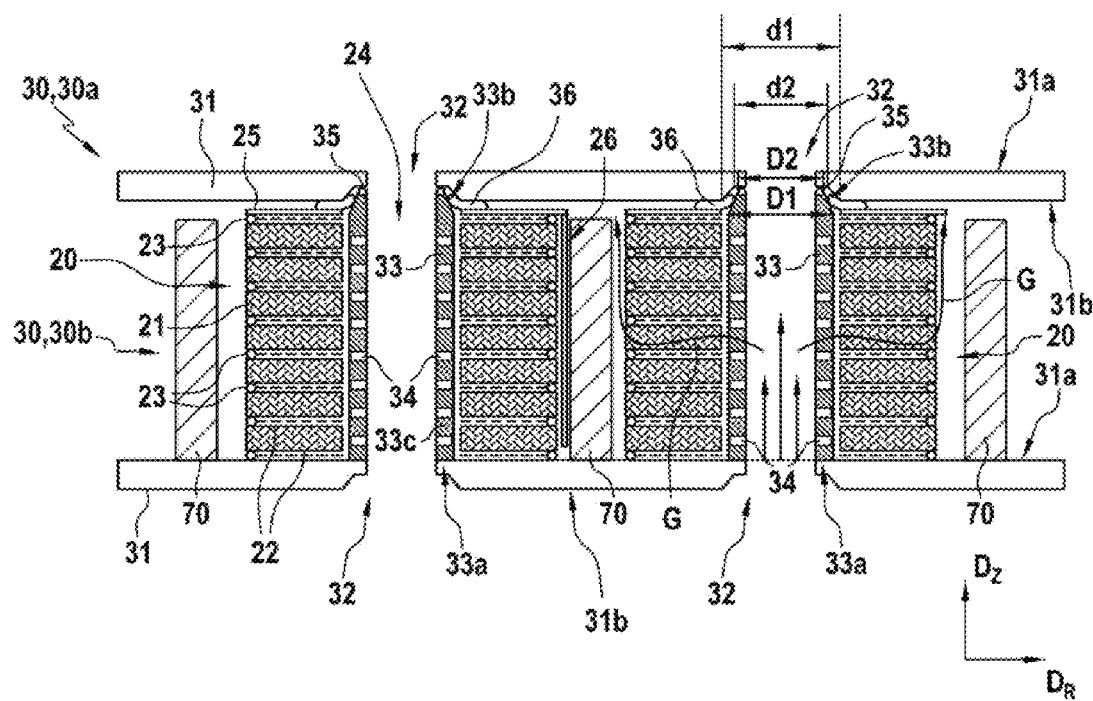
FIG. 8 schematically shows a sectional view of one example of an individual module according to another embodiment of the invention.

A chemical vapor infiltration densification method according to the invention comprises firstly a step during which a plurality of stacks of porous annular substrates intended to be treated by chemical vapor infiltration are provided.

FIG. 3 illustrates a sectional view of an example of a stack 20 of porous annular substrates 21. The porous annular substrates 21 have cylindrical symmetry and are stacked along a first direction $D_Z$. Each porous annular substrate 21 extends mainly in a plane perpendicular to the first direction $D_Z$. The sectional plane of the illustration in FIG. 3 comprises the first direction $D_Z$ and a second direction $D_R$ perpendicular to the first direction $D_Z$. The first direction $D_Z$ coincides with the axis of symmetry of revolution of the porous annular substrates 21, and the second direction $D_R$ corresponds to a radial direction.

Each porous annular substrate 21 of the stack 20 thus has the shape of a ring with a central passage 21a. Each porous annular substrate 21 is disposed on an annular spacer 22 whose outer radial diameter is smaller than the outer radial diameter of the porous annular substrates 21, the diameters of the orifices of the spacers 22 and of the porous annular substrates 21 being equal.

Each spacer 22 is surrounded by a sealing ring 23 in the plane perpendicular to the first direction $D_Z$. Each porous annular substrate 21 thus rests on an annular spacer 22 and a sealing ring 23.

The alternating stack of porous annular substrates 21 and spacers 22 forms, at the center of stack 20, an internal volume 24 of stack 20.

In addition, the stack 20 is closed at its top by an annular cover 25. The cover 25 is placed on the stack via an annular spacer 22 and a sealing ring 23.

The chemical vapor infiltration densification method according to the invention then comprises a step during which a plurality of individual modules 30 are supplied.

FIG. 4 schematically shows a sectional view of an individual module 30 according to the invention.

Each individual module 30 comprises a support plate 31 and several stacks 20 of porous annular substrates 21 disposed on the support plate 30. For each stack 20, the support plate 31 comprises a gas inlet opening 32 and an injection tube 33 mounted on the gas inlet opening 32 and extending into the internal volume 24 of a stack 20 between a first tube end 33a connected to the support plate 31 and a second tube end 33b which is free.

The injection tube 33 further comprises gas injection orifices 34 opening into the internal volume 24.

The chemical vapor infiltration densification method according to the invention then comprises a step during which a stack of individual modules 30 is formed, superimposed on one another, along the first direction $D_Z$ in the chamber of a densification furnace.

FIG. 4 shows the support plate 31 of a first individual module 30a about to be stacked on a second individual module 30b.

The step of forming the stack of individual modules 30 further comprises a step of sealed alignment of the individual modules 30 of the stack. As illustrated in FIG. 4, in order to achieve alignment, the second end 33b of each injection tube 33 of the second individual module 30b is inserted into the gas inlet opening 32 of the first individual module 30a.

To seal the junction between the injection tubes 33 of the second individual module 30b and the gas inlet openings 32 of the first individual module 30a, the second individual module 30a further comprises, for each injection tube 33, an annular seal 35 disposed between the second end 33b of the injection tube 33 of the second individual module 30b and the gas inlet opening 32 of the first individual module 30a with which it cooperates.

More particularly, each support plate 31 comprises a first face 31a on which the stacks 20 are disposed and a second face 31b opposite the first face 31a. The gas inlet opening 32 has a frustoconical shape with a first diameter d1 formed in the second face 31b of the support plate 31 and a second diameter d2 smaller than the first diameter d1 and formed between the first face 31a and the second face 31b of the support plate 31.

The second end 33b of each injection tube 33 comprises a frustoconical shape complementary to the frustoconical shape of a gas inlet opening 32 so that the two frustoconical shapes cooperate together. The complementary frustoconical shape of the second end 33b of the injection tube 33 comprises a first diameter D1 larger than a second diameter D2, the second diameter D2 being measured on a free distal end while the first diameter D1 is measured on a proximal end coupled to the rest of the injection tube 33 and especially to a main portion 33c.

FIGS. 5 and 6 illustrate two examples of an annular seal 35 mounted at the interface between the second end 33b of the injection tube 33 of the second individual module 30b and the gas inlet opening 32 of the first individual module 30a.

FIG. 5 shows a sectional view of an annular seal having a tapered end, and FIG. 6 shows a sectional view of an annular seal having a parallelogram cross-section.

As illustrated in FIG. 4, in order to improve the sealing of the stack of individual modules 30, more particularly to prevent leaks from the annular spaces between the injection tubes 33 and the porous annular substrates 21 to the outside of the stacks 20, when two individual modules 30 are stacked one on top of the other, the lower individual module, here the second individual module 30b, comprises, for each stack 20, a deformable annular seal 36 disposed between the cover 25 of the stack 20 and the support plate 31 of the upper individual module, here the first individual module 30a.

In addition, as illustrated in FIGS. 3 and 4, the stack 20 further comprises three legs (only one per stack is visible in these FIGS. 3 and 4). Each leg 26 extends, along the direction Z in which the porous annular substrates 21 are stacked, from the annular cover 25 toward the support plate 31 on which the stack 20 is disposed.

As illustrated in FIG. 7 which shows an example of a variant embodiment of an injection tube according to the invention, each injection tube 33 can comprise a main tubular portion 33c forming a shoulder 37 with the frustoconical shape of the second end 33b. The shoulder 37 enables the annular seal 35 to deform in a plane perpendicular to the first direction $D_Z$ along which the porous annular substrates 21 are stacked.

The chemical vapor infiltration densification method according to the invention then comprises a step during which a gas phase comprising a gaseous precursor of a matrix material to be deposited within the porosities of substrates 21 is injected into the internal volume 24 of each stack 20 of porous annular substrates 21. The injection of the gas is represented in FIG. 4 by arrows G.

In the embodiment illustrated in FIG. 8, each individual module 30 surmounted by another individual module 30 further comprises a plurality of rods 70 extending between the support plate 31 of the individual module 30 and the support plate 31 of the individual module 30 which surmounts it to take up the mass of the upper individual module or module(s) 30.

Each rod 70 has a height less than the height of the stacks 20 of porous annular substrates 21. More precisely, each rod 70 may have a height less than the sum, in each stack 20, of the thickness of the deformable annular seal 36, of the thickness of the cover ring 25, of the thicknesses of the sealing rings 23, and of the thicknesses of the porous annular substrates 21 of said stack.

The invention claimed is:

1. A method for densification by pressure gradient chemical vapor infiltration of porous annular substrates having a central passage, the method comprising:
    providing a plurality of stacks of porous annular substrates, each stack comprising an internal volume formed by the central passages of the stacked substrates,
    providing a plurality of individual modules, each individual module comprising a support plate and stacks of porous annular substrates disposed on the support plate, the support plate comprising, for each stack, a gas inlet opening emerging into the internal volume,
    forming, in a chamber of a densification furnace, a stack of individual modules, each gas inlet opening of the support plate of a first individual module mounted on a second individual module communicating with the internal volume of one of the stacks of the second individual module so as to allow a gas to flow between the individual modules, and
    injecting into the internal volume of each stack of porous annular substrates a gas phase comprising a gaseous precursor of a matrix material to be deposited within porosities of the substrates,
    wherein, for each second individual module surmounted by a first individual module, each stack comprises at least one cover ring supported on a top of the stack of porous annular substrates via an annular spacer and a sealing ring disposed around the annular spacer in a plane perpendicular to a direction in which the porous annular substrates are stacked, and a deformable annular seal is disposed between the at least one cover ring and the support plate of said first individual module.

2. The method according to claim 1, wherein each deformable annular seal is arranged to be capable of undergoing deformation, along the direction in which the porous annular substrates are stacked, greater than or equal to a thickness of a cover ring.

3. The method according to claim 1, wherein each stack comprises at least three legs extending in the direction in which the porous annular substrates are stacked, from the cover ring to the support plate on which the stack is disposed.

4. The method according to claim 1, wherein the support plate of each individual module comprises, for each stack, an injection tube mounted on the gas inlet opening and extending into the internal volume of the stack between a first tube end connected to the support plate and a second tube end which is free, the injection tube further comprising gas injection openings emerging into the internal volume, each gas inlet opening of the support plate of a first individual module mounted on a second individual module communicating with a second end of one of the injection tubes of the second individual module so as to allow a gas to flow between the individual modules.

5. The method according to claim 4, wherein each support plate comprises a first face on which are disposed stacks and a second face opposite the first face, each gas inlet opening comprises a frustoconical shape with a first diameter formed in the second face of the support and a second diameter smaller than the first diameter and formed in the first face or between the first face and second face of the support plate, and the second end of each injection tube comprises a complementary frustoconical shape cooperating with the frustoconical shape of the gas inlet opening.

6. The method according to claim 4, further comprising a sealed alignment step of the individual modules of the stack, the second end of each injection tube of the second individual module being inserted into a gas inlet opening of the first individual module, and the second individual module further comprising, for each injection tube, an annular tube seal disposed between the second end of the injection tube of the second individual module and the gas inlet opening of the first individual module with which it cooperates.

7. The method according to claim 6, wherein each injection tube comprises a main tubular portion forming a shoulder with a frustoconical shape of the second end, the shoulder allowing the annular seal to deform in a plane perpendicular to the direction along which the porous annular substrates are stacked.

8. The method according to claim 6, wherein each annular seal is frustoconical in shape.

9. The method according to claim 4, wherein each support plate comprises, for each injection tube, a centering ring centered around a gas opening and shaped to receive the injection tube.

10. The method according to claim 1, wherein each porous annular substrate comprises carbon.

11. The method according to claim 1, wherein each porous annular substrate constitutes a fibrous brake disc preform.

12. The method according to claim 1, wherein each individual module surmounted by another individual module comprises a plurality of rods extending between the support plate of said individual module and the support plate of said individual module which surmounts it to take up a mass of said other individual module.

13. The method of claim 12, wherein each rod has a height less than a height of the stacks of porous annular substrates.

* * * * *